US012417194B2

(12) United States Patent
Sethuraman et al.

(10) Patent No.: US 12,417,194 B2
(45) Date of Patent: Sep. 16, 2025

(54) PROGRAMMABLE MEMORY CONTROLLER CIRCUITS AND METHODS

(71) Applicant: Intel Corporation, Santa Clara, CA (US)

(72) Inventors: Saravanan Sethuraman, Penang (MY); Chang Kian Tan, Penang (MY)

(73) Assignee: Altera Corporation, San Jose, CA (US)

( * ) Notice: Subject to any disclaimer, the term of this patent is extended or adjusted under 35 U.S.C. 154(b) by 834 days.

(21) Appl. No.: 17/478,040

(22) Filed: Sep. 17, 2021

(65) Prior Publication Data

US 2022/0005521 A1 Jan. 6, 2022

(51) Int. Cl.
*G06F 13/16* (2006.01)
*H03K 19/17736* (2020.01)

(52) U.S. Cl.
CPC ...... *G06F 13/1689* (2013.01); *G06F 13/1684* (2013.01); *H03K 19/17744* (2013.01)

(58) Field of Classification Search
CPC ............. G06F 13/1668; G06F 13/1673; G06F 13/1689; G06F 13/1684
USPC ........................................................ 711/105
See application file for complete search history.

(56) References Cited

U.S. PATENT DOCUMENTS

| 7,272,677 B1 * | 9/2007 | Venkata | G06F 1/12 710/1 |
|---|---|---|---|
| 10,664,561 B1 * | 5/2020 | Kar | G06F 30/343 |
| 10,931,283 B2 | 2/2021 | Tan et al. | |
| 2009/0190427 A1 * | 7/2009 | Brittain | G11C 5/143 365/212 |
| 2018/0225235 A1 * | 8/2018 | Lee | G06F 11/1048 |
| 2018/0300105 A1 * | 10/2018 | Langhammer | G06F 17/16 |

(Continued)

FOREIGN PATENT DOCUMENTS

DE 3934145 4/1990

OTHER PUBLICATIONS

G. A. Van Huben et al., "Server-class DDR3 SDRAM memory buffer chip," in IBM Journal of Research and Development, vol. 56, No. 1.2, p. 3:1-3:11, Jan.-Feb. 2012, doi: 10.1147/JRD.2011.2177897. (Year: 2012).*

(Continued)

*Primary Examiner* — Reginald G Bragdon
*Assistant Examiner* — Aaron D Ho
(74) *Attorney, Agent, or Firm* — InventIQ Legal LLP; Steven J. Cahill

(57) ABSTRACT

A memory controller circuit includes a first channel circuit having a first programmable switch circuit that is programmable to provide a first request signal indicating a first data access request to a memory circuit. The first programmable switch circuit is programmable to provide a first write data signal indicating first data for storage in the memory circuit. The memory controller circuit includes a second channel circuit having a second programmable switch circuit that is programmable to provide one of the first request signal received from the first programmable switch circuit or a second request signal indicating a second data access request to the memory circuit. The second programmable switch circuit is programmable to provide one of the first write data signal received from the first programmable switch circuit or a second write data signal indicating second data for storage in the memory circuit.

20 Claims, 4 Drawing Sheets

(56) References Cited

U.S. PATENT DOCUMENTS

2019/0129870 A1\* 5/2019 Atsatt ................. G06F 13/4027
2019/0214996 A1 7/2019 Tan et al.

OTHER PUBLICATIONS

European Patent Office, extended European Search Report and European Search Opinion for European patent application 22182236.4 dated Dec. 7, 2022, pp. 1-11.

\* cited by examiner

PROGRAMMABLE MEMORY CONTROLLER CIRCUITS AND METHODS

FIELD OF THE DISCLOSURE

The present disclosure relates to electronic circuits, and more particularly, to programmable memory controller circuits and methods.

BACKGROUND

Many computing systems used for artificial intelligence (AI) and machine learning (ML) applications include one or more processor circuits each having arrays of processing cores that communicate with multiple memory subsystems. As the performance of computing systems increases, the computing systems require faster memory subsystems that have larger bandwidths. AI and ML applications for vision, voice, and gesture recognition often demand hundreds of gigabytes per second (GB/s) of memory bandwidth from external input/output devices to feed the arrays of processing cores in a processor circuit with data.

DETAILED DESCRIPTION

High Bandwidth Memory (HBM) is a high-speed computer memory interface for synchronous dynamic random-access memory (SDRAM). HBM can provide high bandwidth and memory capacity at low power for data transfers to and from an integrated circuit, such as a field programmable gate array (FPGA) or microprocessor. However, data is driven to and from HBM circuits via memory controller blocks for processing, which may result in high routing congestion and may reduce the maximum frequency of an FPGA. To overcome this constraint, users of FPGAs typically limit the frequency of the HBM memory controller and/or deeply tree and pipeline the data path to and from the HBM memory controller and the FPGA. However, the lower frequency HBM memory controller causes data stalls and increases the communication overhead and power consumption of the system. Also, the deeply pipelined data path increases the latency of memory accesses, which degrades performance significantly.

According to some embodiments disclosed herein, programmable switch circuits are provided that can be programmed to cascade multiple channel circuits together to operate as a 1-to-N or N-to-N memory controller system for performing read and write accesses to one or more external memory circuits in a memory system. N can be any positive integer greater than 1. In 1-to-N or N-to-N modes, the programmable switch circuits can significantly reduce the amount of routing wires used to transmit signals to and from the external memory circuits. As a result, the programmable switch circuits reduce duplication of routing resources, reduce routing congestion, improve signal integrity, and increase the effective utilization of area in the memory system. The programmable switch circuits also reduce hot spots and improve thermal distribution in the memory system by providing a smaller number of wires for transmitting signals to and from the external memory circuits. The read and write accesses may be performed with a single set of control signals or multiple independent control signals.

Cascading multiple channel circuits together in a memory controller circuit for performing memory accesses optimizes the usage of the interface bandwidth of the memory controller circuit, as discussed in further detail below. These embodiments can, for example, provide more efficient transfer of data to and from external memory circuits for high-bandwidth applications, such as artificial intelligence (AI) and machine learning (ML) applications that frequently update the weights of neural networks, image maps, and other multicast data. AI and ML applications can, for example, store and compute data in a disaggregated manner within memory in a processing circuit and send commands and data to external memory circuits using the programmable switch circuit.

Figure 1:
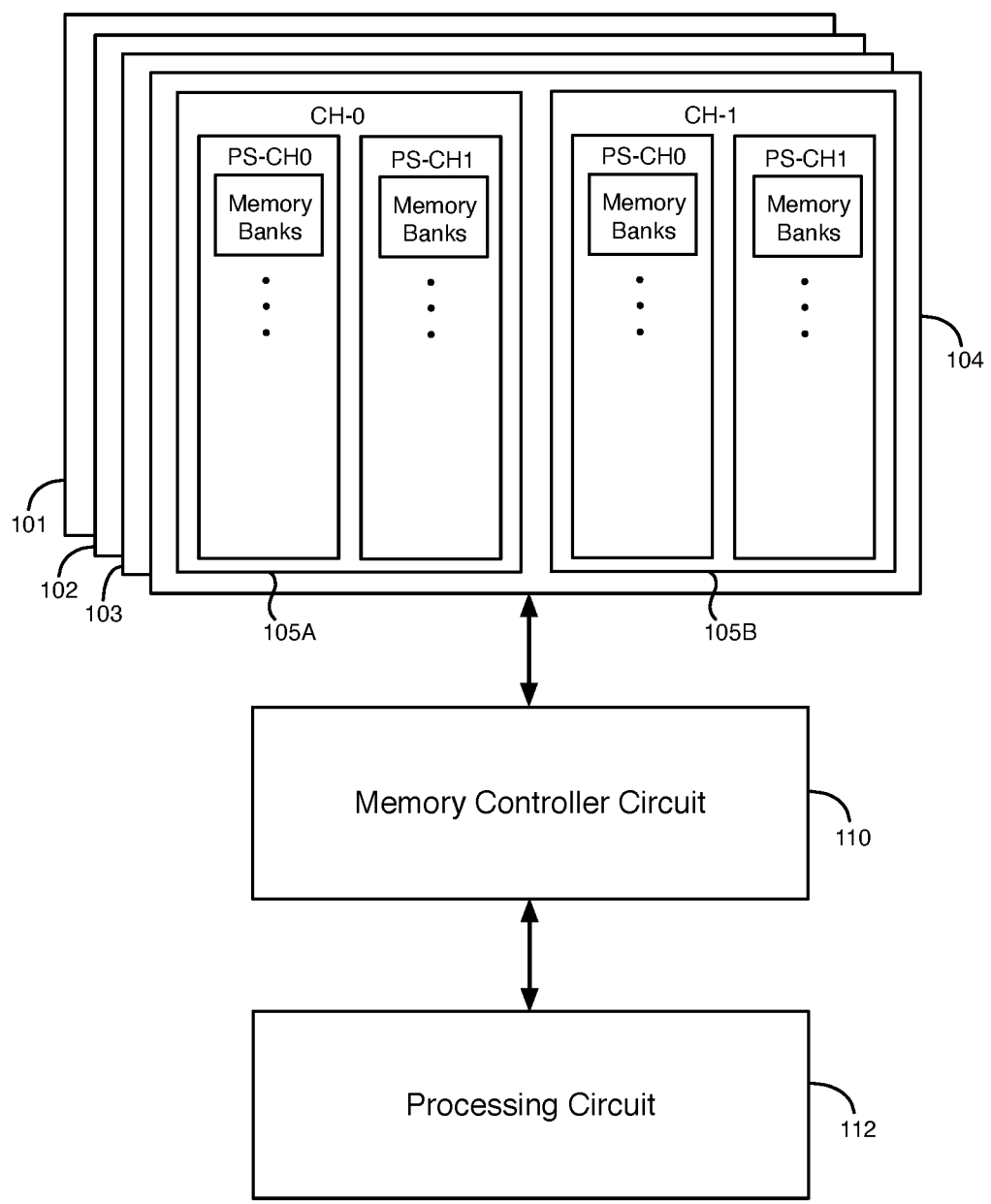
FIG. 1 illustrates an example of a system that includes a processing circuit, a memory controller circuit, and four external memory circuits, according to an embodiment.

Figure (FIG. 1 illustrates an example of a system including a processing circuit 112, a memory controller circuit 110, and four external memory circuits 101-104, according to an embodiment. The memory circuits 101-104 may be 4 separate memory integrated circuits 101-104 or in 1, 2, or 3 integrated circuits. Each of the memory circuits 101-104 includes multiple channels. Each of these channels includes multiple pseudo-channels. Each of the pseudo-channels has multiple memory banks. Each of the memory banks has several memory circuits (e.g., memory cells) for storing data. For example, memory circuit 104 includes two channels 105A-105B (CH-0 and CH-1), each of the channels 105A and 105B includes two pseudo-channels PS-CH0 and PS-CH1, and each of the pseudo-channels includes several memory banks of memory circuits.

Processing circuit 112 can write data into the memory circuits 101-104 and read data stored in memory circuits 101-104 using memory controller circuit 110. Processing circuit 112 provides write data to be stored in one or more of memory circuits 101-104 to memory controller circuit 110 during a write operation. Memory controller circuit 110 provides the write data to one or more of the memory circuits 101-104 for storage in the memory circuits during the write operation. Memory controller circuit 110 accesses data stored in one or more of memory circuits 101-104 during a read operation and provides the accessed data to the processing circuit 112.

Processing circuit 112 may be, for example, a microprocessor integrated circuit (IC), a programmable logic IC such as an FPGA, a graphics processing unit IC, or an application specific IC. Memory controller circuit 110 may be, for example, in the same IC as processing circuit 112 (e.g., in an FPGA or microprocessor), or memory controller circuit 110 and processing circuit 112 may be in separate integrated circuits (ICs).

Figure 2:
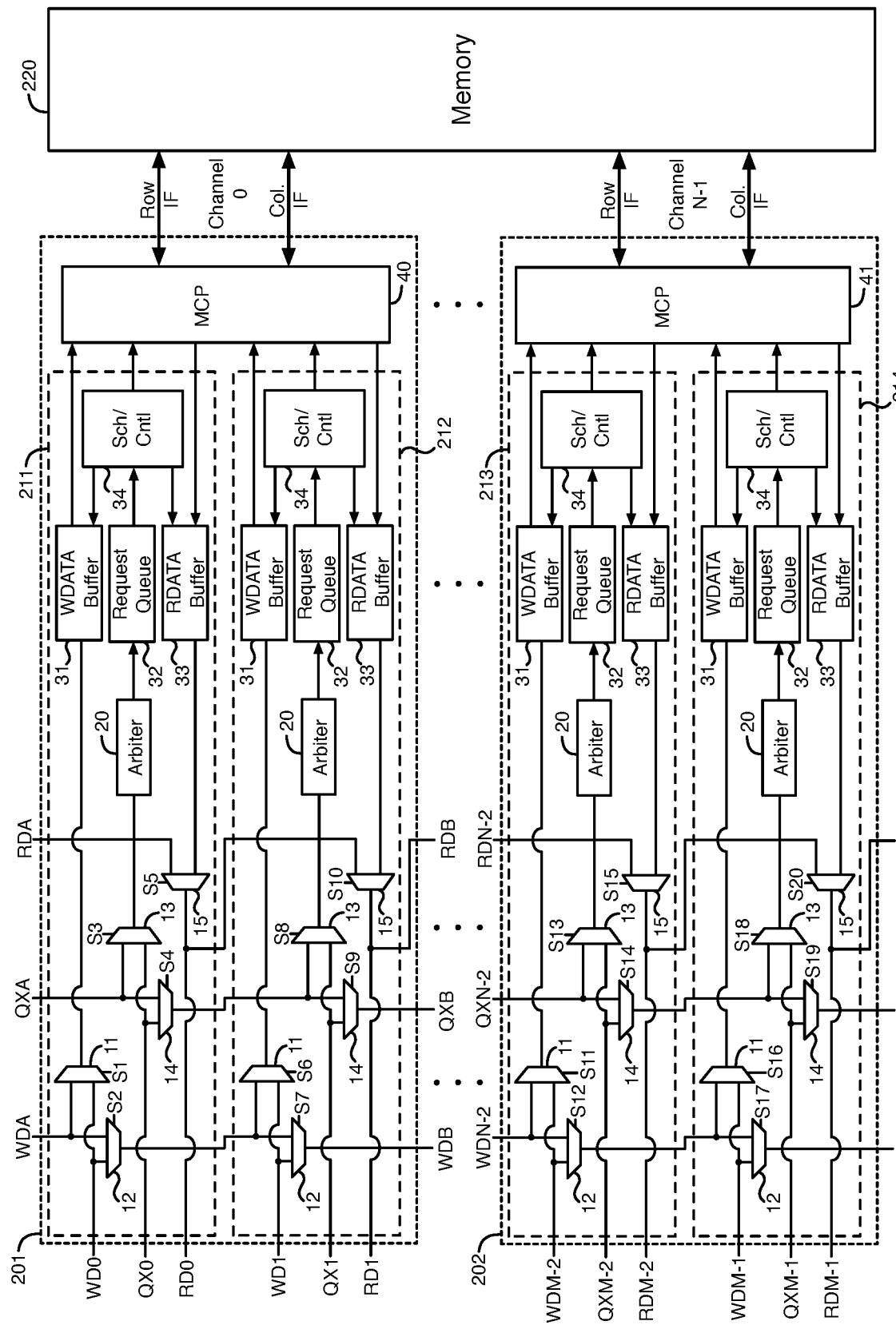
FIG. 2 illustrates details of examples of data channel circuits in a memory controller circuit and a memory circuit, according to an embodiment.

FIG. 2 illustrates details of examples of data channel circuits 201-202 in memory controller circuit 110 and a memory circuit 220, according to an embodiment. Memory circuit 220 is an example of one or more of the memory circuits 101-104 of FIG. 1. Memory circuit 220 may be in one or more memory ICs. Data channel circuits 201-202 are in memory controller circuit 110 of FIG. 1. Memory controller circuit 110 includes an N number of data channel circuits and an M number of pseudo-channel circuits, where N is any integer greater than 1, and M equals 2N. The data channel circuits and the pseudo-channel circuits may both be referred to herein as channel circuits. Only two data channel circuits 201-202 are shown in FIG. 2 as an example. Each data channel circuit includes 2 pseudo-channel circuits. Data channel circuit 201 includes 2 pseudo-channel circuits 211-212 and memory command processing (MCP) circuit 40, and data channel circuit 202 includes 2 pseudo-channel circuits 213-214 and memory command processing (MCP) circuit 41. Each of the pseudo-channel circuits 211-214 in memory controller circuit 110 includes 5 multiplexer circuits 11-15, arbiter circuit 20, write data buffer circuit 31, request queue circuit 32, read data buffer circuit 33, and scheduler and control circuit 34.

The multiplexer circuits 11-15 in the pseudo-channel circuits 211-214 form programmable switch circuits that can be programmed to cause the memory controller circuit 110 to function in one of 2 write data modes and in one of 2 command modes. The 2 write data modes are 1-to-N write data mode and N-to-N write data mode, and the 2 command modes are 1-to-N command mode and N-to-N command mode. The programmable switch circuits can be programmed to operate in one of these 2 write data modes and in one of these 2 command modes by controlling the logic states of select signals that control multiplexer circuits 11-15 in each of the pseudo-channel circuits 211-214. Select signals S1-S5 control the selections of multiplexer circuits 11-15, respectively, in pseudo-channel circuit 211. Select signals S6-S10 control the selections of multiplexer circuits 11-15, respectively, in pseudo-channel circuit 212. Select signals S11-S15 control the selections of multiplexer circuits 11-15, respectively, in pseudo-channel circuit 213. Select signals S16-S20 control the selections of multiplexer circuits 11-15, respectively, in pseudo-channel circuit 214.

A write data signal and a request signal may be provided to inputs of any of the pseudo-channel circuits 211-214 from processing circuit 112, depending on the mode that memory controller circuit 110 is operating in. Write data signals WD0, WD1, WDM-2, and WDM-1 may be provided to inputs of pseudo-channel circuits 211-214, respectively, from processing circuit 112. Request signals QX0, QX1, QXM-2, and QXM-1 may be provided to inputs of pseudo-channel circuits 211-214, respectively, from processing circuit 112. Read data signals RD0, RD1, RDM-2, and RDM-1 may be provided from outputs of pseudo-channel circuits 211-214, respectively, to processing circuit 112.

A write data signal, a request signal, and a read data signal may be provided to inputs of any of the pseudo-channel circuits 212-214 from an adjacent one of the pseudo-channel circuits 211-214, depending on the mode that memory controller circuit 110 is operating in. For example, one or more of write data signal WDA, request signal QXA, or read data signal RDA may be provided to inputs of pseudo-channel circuit 211. One or more of write data signal WDN-2, request signal QXN-2, or read data signal RDN-2 may be provided to inputs of pseudo-channel circuit 213. Any of the pseudo-channel circuits 211-214 may output one or more of a write data signal, a request signal, or a read data signal to an adjacent one of the pseudo-channel circuits using multiplexer circuits 12, 14, and 15, depending on the mode that memory controller circuit 110 is operating in. For example, one or more of write data signal WDB, request signal QXB, or read data signal RDB may be output from pseudo-channel circuit 212 to an adjacent one of the pseudo-channel circuits. One or more of write data signal WDN-1, request signal QXN-1, or read data signal RDN-1 may be output from pseudo-channel circuit 214 to an adjacent one of the pseudo-channel circuits.

Each of the pseudo-channel circuits 211-214 may be controlled to provide a write data signal from the processing circuit 112 or from the adjacent pseudo-channel circuit to the write data buffer circuit 31. The multiplexer circuits 11 in pseudo-channel circuits 211-214 may be controlled by select signals S1, S6, S11, and S16, respectively, to provide write data signals to write data buffer circuits 31. For example, multiplexer circuit 11 in pseudo-channel circuit 211 may be controlled by select signal S1 to provide write data signal WD0 or WDA to an input of write data buffer circuit 31. The write data signal received from multiplexer circuit 11 is stored in write data buffer circuit 31 in each of the pseudo-channel circuits 211-214. The write data signal stored in the write data buffer circuit 31 is provided to MCP circuit 40 or 41. MCP circuit 40 or 41 provides the write data indicated by the write data signal received from write data buffer circuit 31 to memory circuit 220 for storage in memory circuit 220 through row or column die-to-die interface (IF) connections.

Each of the pseudo-channel circuits 211-214 may be controlled to provide a request signal from the processing circuit 112 or from the adjacent pseudo-channel circuit to the arbiter circuit 20 and to the request queue circuit 32. The multiplexer circuits 13 in pseudo-channel circuits 211-214 may be controlled by select signals S3, S8, S13, and S18, respectively, to provide request signals to arbiter circuits 20. For example, multiplexer circuit 13 in pseudo-channel circuit 211 may be controlled by select signal S3 to provide request signal QX0 or QXA to arbiter circuit 20.

Arbiter circuit 20 may then provide the request signal received from multiplexer circuit 13 to the request queue circuit 32. Request queue circuit 32 provides the request signal to scheduler and control circuit 34. Scheduler and control circuit 34 controls the transfer of read and write data between write and read data buffer circuits 31 and 33 and MCP circuit 40 or 41. Scheduler and control circuit 34 also controls the transfer of read and write requests between request queue circuit 32 and MCP circuit 40/41.

Scheduler and control circuit 34 provides the request signal received from request queue 32 to MCP circuit 40 or 41. The request signal may indicate a write request to perform a write operation or a read request to perform a read operation. If the request signal indicates a write request, then MCP 40/41 provides the write request to memory circuit 220 with the write data from the write data buffer 31 through row or column die-to-die interface connections.

If the request signal indicates a read request, then MCP 40/41 provides the read request to memory circuit 220 through row or column die-to-die interface connections to access read data from memory circuit 220. Read data accessed from memory circuit 220 in response to a read request from memory controller circuit 110 is provided to MCP 40/41 through the die-to-die connections. MCP 40/41 provides the read data accessed from memory circuit 220 to read data buffer circuit 33 for storage in buffer circuit 33.

Each of the pseudo-channel circuits 211-214 may be controlled to provide a read data signal from the read data buffer circuit 33 or from the adjacent pseudo-channel circuit to the processing circuit 112. The multiplexer circuits 15 in pseudo-channel circuits 211-214 may be controlled by select signals S5, S10, S15, and S20, respectively, to provide read data signals to processing circuit 112. For example, multiplexer circuit 15 in pseudo-channel circuit 211 may be controlled by select signal S5 to provide the read data signal RDA or the read data output signal of read data buffer circuit 33 to processing circuit 112 as read data signal RD0.

Figure 3:
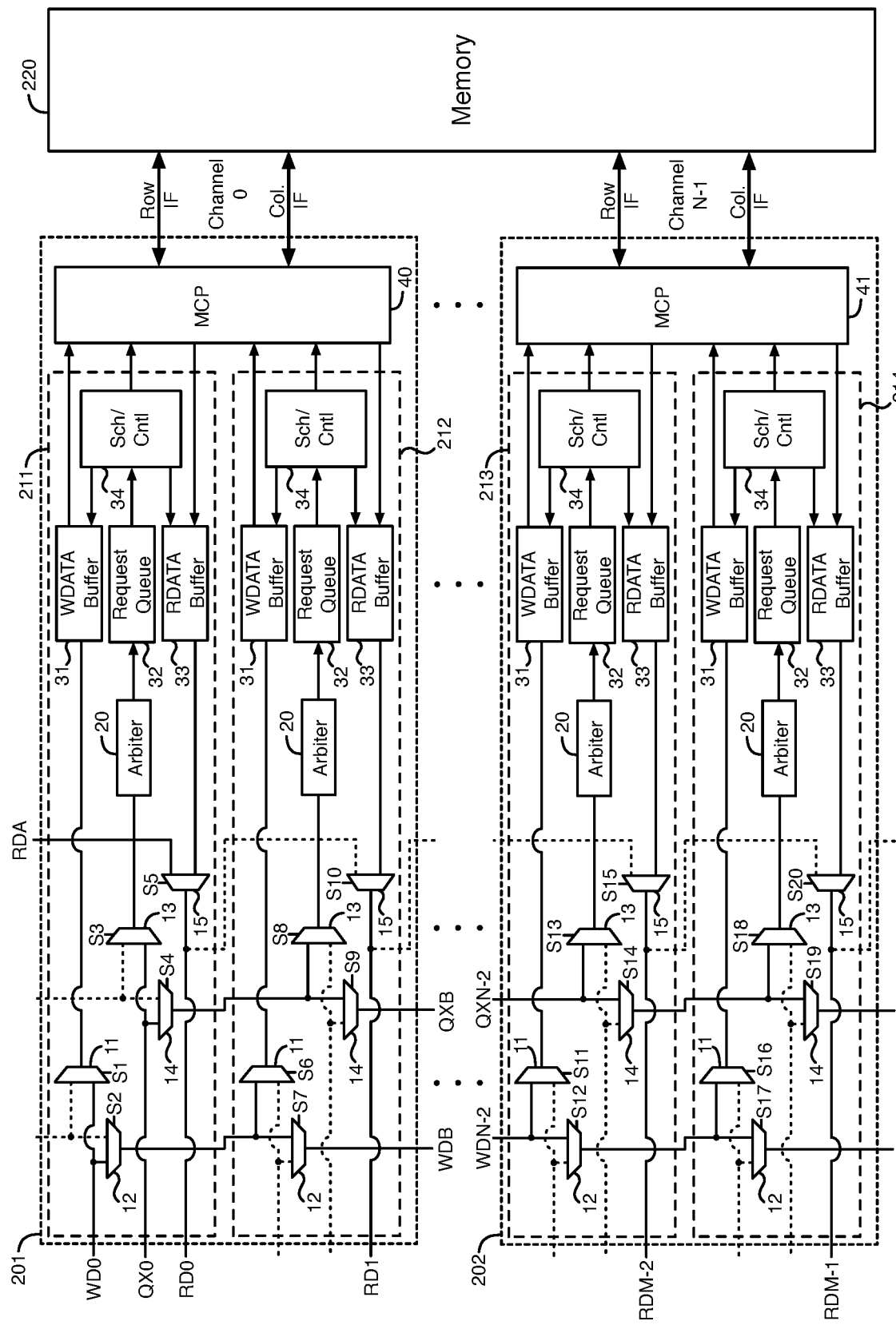
FIG. 3 illustrates further details of the exemplary memory controller circuit of FIG. 2 configured in a 1-to-N write data mode and in a 1-to-N command mode, according to an embodiment.

FIG. 3 illustrates further details of the exemplary memory controller circuit 110 of FIG. 2 configured in 1-to-N write data and command modes, according to an embodiment. The memory controller circuit 110 of FIG. 3 includes an N number of data channel circuits, including data channel circuits 201-202. In FIG. 3, memory controller circuit 110 is configured in 1-to-N write data mode and in 1-to-N command mode. In the 1-to-N command mode, processing circuit 112 only transmits a single request signal QX0 to the memory controller circuit 110. In 1-to-N write data mode, processing circuit 112 only transmits a single write data signal WD0 to the memory controller circuit 110. The memory controller circuit 110 transmits the request signal QX0 and the write data signal WD0 received from processing circuit 112 to all 2N pseudo-channel (PS-CH) circuits in memory controller circuit 110.

In the 1-to-N write data mode of FIG. 3, data indicated by the write data signal WD0 is transmitted to all M (i.e., 2N) pseudo-channel (PS-CH) circuits (including PS-CH circuits 211-214) in memory controller circuit 110. The request signal QX0 may indicate a read request to perform a read operation or a write request to perform a write operation. If request signal QX0 indicates a write request, memory controller circuit 110 provides the data indicated by write data signal WD0 through each of the PS-CH circuits to memory circuit 220. Memory circuit 220 then stores the data received from memory controller circuit 110 in memory in M pseudo-channels in memory circuit 220 in response to the write request indicated by request signal QX0. The 1-to-N write data mode may, for example, be used in artificial intelligence (AI) and machine learning (ML) applications to load weights of neural networks into memory in M pseudo-channels in memory circuit 220 using a single write data signal WD0.

In 1-to-N write data and command modes, the routing wires within memory controller circuit 110 and the routing wires between processing circuit 112 and memory controller circuit 110 may be significantly reduced. The solid lines in FIGS. 3-4 indicate wires (i.e., conductive lines) that are used to transmit signals, and the dotted lines connected to the multiplexers in FIGS. 3-4 indicate wires from FIG. 2 that are not used in FIGS. 3-4. The dotted lines connected to the multiplexers in FIGS. 3-4 indicate routing wires that are either unused existing wires or are wires that are removed from the memory controller circuit 110 entirely to reduce routing congestion and to increase routing efficiency. As an example, in the embodiment of FIG. 3, the used or available routing wires may be reduced by about half compared to FIG. 2. The reduced routing wires in FIG. 3 can also increase the maximum signal frequency in the memory controller circuit 110. FIG. 3 can also reduce logic resource usage in processing circuit 112, because multiple request signals and multiple write data signals are not generated.

In the 1-to-N command mode, the programmable switch circuits in memory controller circuit 110 provide the request signal QX0 to the arbiter circuit 20 in each of the 2N pseudo-channel (PS-CH) circuits to perform a read or write operation, as described below. Also, in the 1-to-N write data mode, the programmable switch circuits in memory controller circuit 110 provide the write data signal WD0 to the write data buffer circuit 31 in each of the M (i.e., 2N) pseudo-channel (PS-CH) circuits for a write operation, as described below.

In 1-to-N command mode, select signal S3 causes the multiplexer circuit 13 in PS-CH circuit 211 to provide request signal QX0 to arbiter circuit 20 in PS-CH circuit 211. Select signal S4 causes multiplexer circuit 14 in PS-CH circuit 211 to provide request signal QX0 to data inputs of multiplexer circuits 13-14 in PS-CH circuit 212. The other data inputs of multiplexer circuits 13-14 in PS-CH circuits 211-212 do not receive signals. Select signal S8 causes the multiplexer circuit 13 in PS-CH circuit 212 to provide request signal QX0 to arbiter circuit 20 in PS-CH circuit 212. Select signal S9 causes multiplexer circuit 14 in PS-CH circuit 212 to provide request signal QX0 from PS-CH circuit 212 to data inputs of multiplexer circuits 13-14 in the next PS-CH circuit as request signal QXB.

The request signal QX0/QXB is sequentially provided to each subsequent PS-CH circuit in memory controller circuit 110. For example, the request signal QX0/QXB is provided from a previous data channel circuit in memory controller circuit 110 to the PS-CH circuits 213-214 in data channel circuit 202 as request signal QXN-2. Select signal S13 causes the multiplexer circuit 13 in PS-CH circuit 213 to provide request signal QXN-2 to arbiter circuit 20 in PS-CH circuit 213. Select signal S14 causes multiplexer circuit 14 in PS-CH circuit 213 to provide request signal QXN-2 to data inputs of multiplexer circuits 13-14 in PS-CH circuit 214. Select signal S18 causes multiplexer circuit 13 in PS-CH circuit 214 to provide request signal QXN-2 to arbiter circuit 20 in PS-CH circuit 214. Select signal S19 causes multiplexer circuit 14 in PS-CH circuit 214 to provide request signal QXN-2 from PS-CH circuit 214 to data inputs of multiplexer circuits 13-14 in the next PS-CH circuit as request signal QXN-1.

During a write operation, select signal S1 causes multiplexer circuit 11 in PS-CH circuit 211 to provide write data signal WD0 to write data buffer circuit 31 in PS-CH circuit 211. Select signal S2 causes multiplexer circuit 12 in PS-CH circuit 211 to provide write data signal WD0 to data inputs of multiplexer circuits 11-12 in PS-CH circuit 212. The other data inputs of multiplexer circuits 11-12 in PS-CH circuits 211-212 do not receive signals. Select signal S6 causes multiplexer circuit 11 in PS-CH circuit 212 to provide write data signal WD0 to write data buffer circuit 31 in PS-CH circuit 212. Select signal S7 causes multiplexer circuit 12 in PS-CH circuit 212 to provide write data signal WD0 to data inputs of multiplexer circuits 11-12 in the next PS-CH circuit as write data signal WDB.

The write data signal WD0/WDB is sequentially provided to each subsequent PS-CH circuit in memory controller circuit 110 in 1-to-N write data mode during a write operation. For example, the write data signal is provided from a previous data channel circuit in memory controller circuit 110 to the PS-CH circuits 213-214 in data channel circuit 202 as write data signal WDN-2. Select signal S11 causes multiplexer circuit 11 in PS-CH circuit 213 to provide write data signal WDN-2 to write data buffer circuit 31 in PS-CH circuit 213. Select signal S12 causes multiplexer circuit 12 in PS-CH circuit 213 to provide write data signal WDN-2 to data inputs of multiplexer circuits 11-12 in PS-CH circuit 214. Select signal S16 causes multiplexer circuit 11 in PS-CH circuit 214 to provide write data signal WDN-2 to write data buffer circuit 31 in PS-CH circuit 214. Select signal S17 causes multiplexer circuit 12 in PS-CH circuit 214 to provide write data signal WDN-2 to data inputs of multiplexer circuits 11-12 in the next PS-CH circuit as write data signal WDN-1.

In the 1-to-N write data mode, each of the PS-CH circuits 211-214 provides the write data indicated by the write data signal WD0 from the write data buffer circuit 31 to memory circuit 220 through MCP circuit 40 or 41. If the request signal QX0 indicates a write request in the 1-to-N command mode, each of the PS-CH circuits 211-214 provides the write request indicated by the request signal QX0 from the arbiter circuit 20 to memory circuit 220 through the request queue 32, scheduler and control circuit 34, and MCP circuit 40 or 41. Memory circuit 220 stores the write data received from each of the PS-CH circuits 211-214 in memory in a respective one of the pseudo-channels in memory circuit 220 in response to the write request. Thus, the write data received from PS-CH circuits 211-214 are stored in 4 different portions of memory circuit 220.

If the request signal QX0 indicates a read request in the 1-to-N command mode, each of the PS-CH circuits 211-214 provides the read request indicated by request signal QX0 from the arbiter circuit 20 to memory circuit 220 through the request queue 32, scheduler and control circuit 34, and MCP circuit 40 or 41. In response to the received read request, memory circuit 220 accesses read data from the pseudo-channels and provides the accessed read data to the respective MCP circuits 40 or 41. Each of the PS-CH circuits 211-214 provides the respective read data from MCP circuit 40 or 41 to the respective read data buffer circuit 33. Multiplexer circuits 15 in the PS-CH circuits 211-214 then provide the read data from read data buffer circuits 33 to processing circuit 112 as read data signals RD0, RD1, RDM-2, and RDM-1, respectively.

Figure 4:
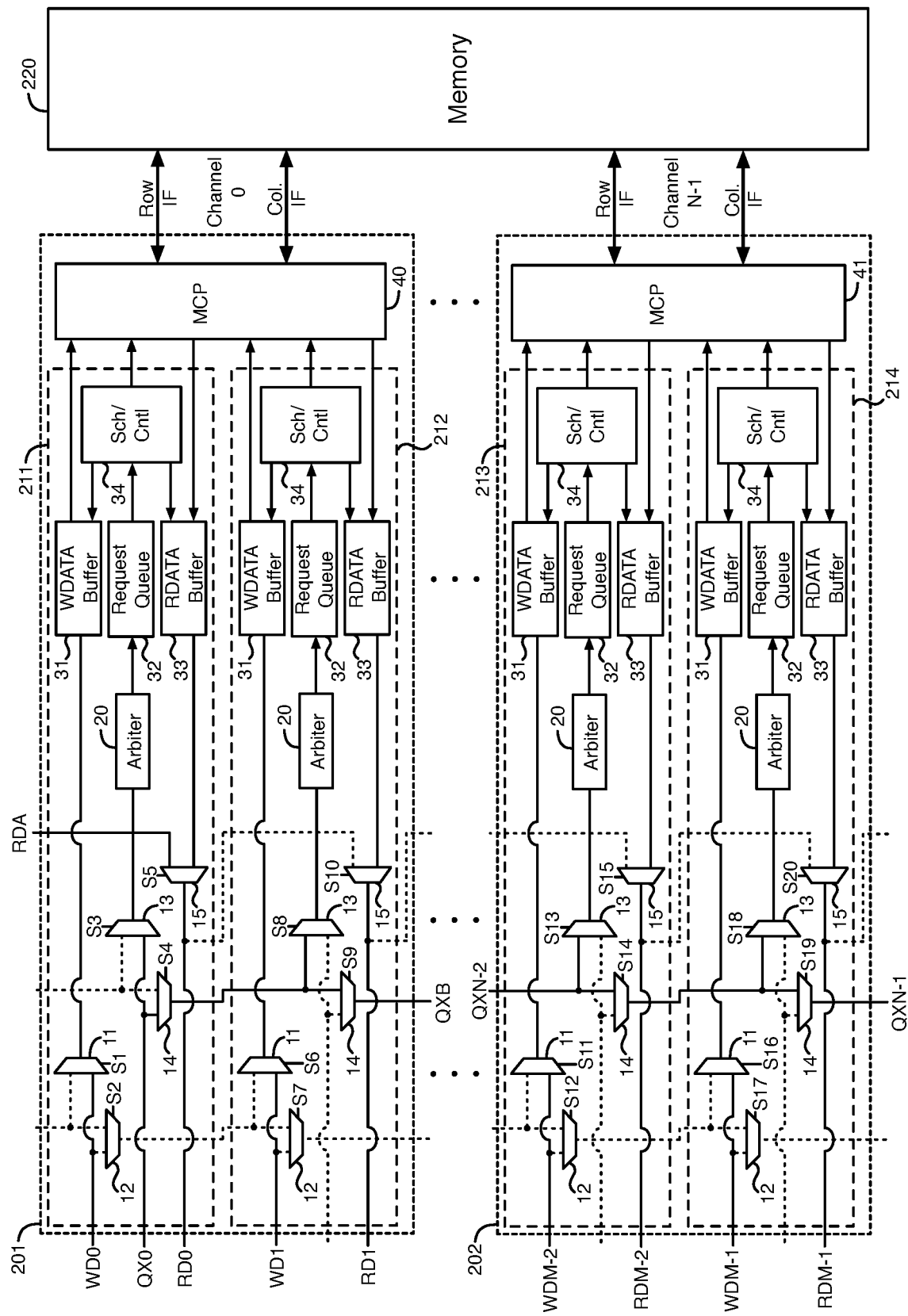
FIG. 4 illustrates further details of the exemplary memory controller circuit of FIG. 2 configured in a 1-to-N command mode and in an N-to-N write data mode, according to an embodiment.

FIG. 4 illustrates further details of the exemplary memory controller circuit 110 of FIG. 2 configured in 1-to-N command mode and in N-to-N write data mode, according to an embodiment. The memory controller circuit 110 of FIG. 4 includes an N number of data channel circuits, including data channel circuits 201-202. In FIG. 4, memory controller circuit 110 is configured in N-to-N write data mode and in 1-to-N command mode. In the 1-to-N command mode, processing circuit 112 only transmits a single request signal QX0 to the memory controller circuit 110. The memory controller circuit 110 transmits the request signal QX0 received from processing circuit 112 to all M (i.e., M=2N) pseudo-channel (PS-CH) circuits in memory controller circuit 110, as described above with respect to FIG. 3. In N-to-N write data mode, processing circuit 112 transmits a different write data signal to each of the M pseudo-channel (PS-CH) circuits in memory controller circuit 110. For example, as shown in FIG. 4, write data signals WD0, WD1, WDM-2, and WDM-1 are transmitted to multiplexer circuits 11 in PS-CH circuits 211, 212, 213, and 214, respectively.

During a write operation in N-to-N write data mode, memory controller circuit 110 provides the data indicated by write data signals WD0, WD1, WDM-2, and WDM-1 through PS-CH circuits 211-214, respectively, and MCP circuits 40/41 to memory circuit 220. Memory circuit 220 then stores the data received from memory controller circuit 110 in memory in M pseudo-channels in memory circuit 220 in response to a write request indicated by request signal QX0. The N-to-N write data mode may, for example, be used in artificial intelligence (AI) and machine learning (ML) applications to store image data in M pseudo-channels in memory circuit 220.

In the embodiment of FIG. 4, the 1-to-N command mode functions as described above with respect to FIG. 3. In the 1-to-N command mode of FIG. 4, the routing wires within memory controller circuit 110 and the routing wires between processing circuit 112 and memory controller circuit 110 are reduced compared to FIG. 2, which reduces routing congestion and increases routing efficiency. In the N-to-N write data mode of FIG. 4, the programmable switch circuits in memory controller circuit 110 provide the write data signals WD0, WD1, WDM-2, and WDM-1 to the write data buffer circuits 31 in PS-CH circuits 211-214, respectively, during a write operation, as described below.

During a write operation in FIG. 4, select signal S1 causes multiplexer circuit 11 in PS-CH circuit 211 to provide write data signal WD0 to write data buffer circuit 31 in PS-CH circuit 211. Select signal S6 causes multiplexer circuit 11 in PS-CH circuit 212 to provide write data signal WD1 to write data buffer circuit 31 in PS-CH circuit 212. Select signal S11 causes multiplexer circuit 11 in PS-CH circuit 213 to provide write data signal WDM-2 to write data buffer circuit 31 in PS-CH circuit 213. Select signal S16 causes multiplexer circuit 11 in PS-CH circuit 214 to provide write data signal WDM-1 to write data buffer circuit 31 in PS-CH circuit 214. Multiplexer circuits 12 in PS-CH circuits 211-214 are effectively disabled.

In the N-to-N write data mode, PS-CH circuits 211-214 provide the write data indicated by write data signals WD0, WD1, WDM-2, and WDM-1, respectively, from the write data buffer circuits 31 to memory circuit 220 through MCP circuit 40 and 41. If the request signal QX0 indicates a write request in the 1-to-N command mode, each of the PS-CH circuits 211-214 provides the write request indicated by the request signal QX0 from the arbiter circuit 20 to memory circuit 220 through the request queue 32, scheduler and control circuit 34, and MCP circuit 40 or 41. Memory circuit 220 stores the write data that was indicated by write data signals WD0, WD1, WDM-2, and WDM-1 and received from PS-CH circuits 211-214, respectively, in memory in respective ones of the pseudo-channels in memory circuit 220 in response to the write request.

If the request signal QX0 indicates a read request in the 1-to-N command mode, each of the PS-CH circuits 211-214 provides the read request indicated by request signal QX0 to memory circuit 220, as described above with respect to FIG. 3. In response to the received read request, memory circuit 220 accesses read data from memory in the pseudo-channels and provides the accessed read data to MCP circuits 40-41. MCP circuits 40-41 and PS-CH circuits 211-214 provide the received read data to processing circuit 112 as read data signals RD0, RD1, RDM-2, and RDM-1, respectively, as described above with respect to FIG. 3.

The following examples pertain to further embodiments. Example 1 is a memory controller circuit comprising: a first channel circuit comprising a first programmable switch circuit that is programmable to provide a first request signal indicating a first data access request to a memory circuit, wherein the first programmable switch circuit is programmable to provide a first write data signal indicating first data for storage in the memory circuit; and a second channel circuit comprising a second programmable switch circuit that is programmable to provide one of the first request signal received from the first programmable switch circuit or a second request signal indicating a second data access request to the memory circuit, wherein the second programmable switch circuit is programmable to provide one of the first write data signal received from the first programmable switch circuit or a second write data signal indicating second data for storage in the memory circuit.

In Example 2, the memory controller circuit of Example 1 may optionally further include, wherein the first programmable switch circuit comprises: a first multiplexer circuit coupled to provide the first write data signal to a first write data buffer circuit in the first channel circuit; a second multiplexer circuit coupled to provide the first write data signal to the second channel circuit; a third multiplexer circuit coupled to provide the first request signal for transmission to the memory circuit; and a fourth multiplexer circuit coupled to provide the first request signal to the second channel circuit.

In Example 3, the memory controller circuit of Example 2 may optionally further include, wherein the second programmable switch circuit comprises: a fifth multiplexer circuit coupled to provide one of the first write data signal or the second write data signal to a second write data buffer circuit in the second channel circuit; a sixth multiplexer circuit coupled to provide the first write data signal or the second write data signal to a third channel circuit; a seventh multiplexer circuit coupled to provide the first request signal or the second request signal for transmission to the memory circuit; and an eighth multiplexer circuit coupled to provide the first request signal or the second request signal to the third channel circuit.

In Example 4, the memory controller circuit of any one of Examples 1-3 may optionally further comprise: a third channel circuit comprising a third programmable switch circuit that is programmable to provide one of the first request signal received from the second programmable switch circuit or a third request signal indicating a third data access request to the memory circuit, wherein the third programmable switch circuit is programmable to provide one of the first write data signal received from the second programmable switch circuit or a third write data signal indicating third data for storage in the memory circuit.

In Example 5, the memory controller circuit of Example 4 may optionally further comprise: a fourth channel circuit comprising a fourth programmable switch circuit that is programmable to provide one of the first request signal received from the third programmable switch circuit or a fourth request signal indicating a fourth data access request to the memory circuit, wherein the fourth programmable switch circuit is programmable to provide one of the first write data signal received from the third programmable switch circuit or a fourth write data signal indicating fourth data for storage in the memory circuit.

In Example 6, the memory controller circuit of any one of Examples 1 or 4-5 may optionally further include, wherein the first channel circuit further comprises: a first write data buffer circuit coupled to the first programmable switch circuit that stores the first write data signal; and a first read data buffer circuit coupled to the first programmable switch circuit that stores first read data accessed from the memory circuit, wherein the first programmable switch circuit is programmable to provide a first read data signal indicating the first read data to a first output of the memory controller circuit.

In Example 7, the memory controller circuit of Example 6 may optionally include, wherein the second channel circuit further comprises: a second write data buffer circuit coupled to the second programmable switch circuit that stores the second write data signal; and a second read data buffer circuit coupled to the second programmable switch circuit that stores second read data accessed from the memory circuit, wherein the second programmable switch circuit is programmable to provide a second read data signal indicating the second read data to a second output of the memory controller circuit.

In Example 8, the memory controller circuit of Example 7 may optionally include, wherein the first programmable switch circuit comprises a first multiplexer circuit that is programmable to provide the first read data signal or a third read data signal to the first output, and wherein the second programmable switch circuit comprises a second multiplexer circuit that is programmable to provide the second read data signal or an output of the first multiplexer circuit to the second output.

Example 9 is a memory controller circuit comprising: a first channel circuit comprising a first multiplexer circuit that is configured to provide a first request signal to a memory circuit to perform a write operation to a first portion of the memory circuit, wherein the first channel circuit further comprises a second multiplexer circuit configured to provide a first write data signal indicating first data to the memory circuit for storage in the first portion of the memory circuit during the write operation, and wherein the first channel circuit further comprises a third multiplexer circuit configured to provide the first request signal; and a second channel circuit comprising a fourth multiplexer circuit that is configured to provide the first request signal as received from the third multiplexer circuit to the memory circuit to perform the write operation to a second portion of the memory circuit.

In Example 10, the memory controller circuit of Example 9 may optionally include, wherein the first channel circuit further comprises a fifth multiplexer circuit configured to provide the first write data signal to the second channel circuit, and wherein the second channel circuit further comprises a sixth multiplexer circuit configured to provide the first write data signal as received from the fifth multiplexer circuit to the memory circuit for storage in the second portion of the memory circuit during the write operation.

In Example 11, the memory controller circuit of Example 9 may optionally include, wherein the second channel circuit further comprises a fifth multiplexer circuit that is configured to provide a second write data signal indicating second data for storage in the second portion of the memory circuit during the write operation.

In Example 12, the memory controller circuit of Example 9 may optionally include, wherein the second channel circuit further comprises a fifth multiplexer circuit configured to provide the first request signal, and wherein the memory controller circuit further comprises: a third channel circuit comprising a sixth multiplexer circuit that is configured to provide the first request signal as received from the fifth multiplexer circuit to the memory circuit to perform the write operation to a third portion of the memory circuit.

In Example 13, the memory controller circuit of Example 12 may optionally include, wherein the first channel circuit further comprises a seventh multiplexer circuit configured to provide the first write data signal to the second channel circuit, wherein the second channel circuit further comprises an eighth multiplexer circuit configured to provide the first write data signal to the third channel circuit, and wherein the third channel circuit further comprises a ninth multiplexer circuit configured to provide the first write data signal indicating the first data for storage in the third portion of the memory circuit during the write operation.

In Example 14, the memory controller circuit of Example 12 may optionally include, wherein the second channel circuit further comprises a seventh multiplexer circuit that is configured to provide a second write data signal indicating second data for storage in the second portion of the memory circuit during the write operation, and wherein the third channel circuit further comprises an eighth multiplexer circuit that is configured to provide a third write data signal indicating third data for storage in the third portion of the memory circuit during the write operation.

In Example 15, the memory controller circuit of any one of Examples 9-14 may optionally include, wherein the first channel circuit further comprises a fifth multiplexer circuit configured to provide a first read data signal indicating first read data accessed from the first portion of the memory circuit to a first output of the memory controller circuit, and wherein the second channel circuit further comprises a sixth multiplexer circuit configured to provide a second read data signal indicating second read data accessed from the second portion of the memory circuit to a second output of the memory controller circuit.

Example 16 is a method for storing data in a memory circuit using a memory controller circuit, the method comprising: providing a first request signal indicating a first data access request to the memory circuit through a first programmable switch circuit in a first channel circuit in the memory controller circuit; providing a first write data signal indicating first data for storage in the memory circuit through the first programmable switch circuit; providing one of the first request signal received from the first programmable switch circuit or a second request signal indicating a second data access request to the memory circuit through a second programmable switch circuit in a second channel circuit in the memory controller circuit; and providing one of the first write data signal received from the first programmable switch circuit or a second write data signal indicating second data for storage in the memory circuit through the second programmable switch circuit.

In Example 17, the method of Example 16 may optionally further comprise: providing one of the first request signal received from the second programmable switch circuit or a third request signal indicating a third data access request to the memory circuit through a third programmable switch circuit in a third channel circuit in the memory controller circuit; and providing one of the first write data signal received from the second programmable switch circuit or a third write data signal indicating third data for storage in the memory circuit through the third programmable switch circuit.

In Example 18, the method of any one of Examples 16-17 may optionally further comprise, wherein providing the first request signal to the memory circuit through the first programmable switch circuit further comprises providing the first request signal for transmission to the memory circuit through a first multiplexer circuit, and wherein providing the first write data signal through the first programmable switch circuit further comprises providing the first write data signal for transmission to the memory circuit through a second multiplexer circuit.

In Example 19, the method of Example 18 may optionally further comprise: providing the first write data signal to the second channel circuit through a third multiplexer circuit; and providing the first request signal to the second channel circuit through a fourth multiplexer circuit.

In Example 20, the method of Example 19 may optionally include, wherein providing one of the first request signal or the second request signal through the second programmable switch circuit further comprises providing one of the first request signal received from the fourth multiplexer circuit or the second request signal through a fifth multiplexer circuit, and wherein providing one of the first write data signal or the second write data signal through the second programmable switch circuit further comprises providing one of the first write data signal received from the third multiplexer circuit or the second write data signal through a sixth multiplexer circuit.

The foregoing description of the exemplary embodiments has been presented for the purpose of illustration. The foregoing description is not intended to be exhaustive or to be limiting to the examples disclosed herein. In some instances, various features can be employed without a corresponding use of other features as set forth. Many modifications, substitutions, and variations are possible in light of the above teachings, without departing from the scope of the present embodiments.

What is claimed is:

1. A memory controller circuit comprising:
   a memory command processing circuit;
   a first channel circuit comprising a first programmable switch circuit that is programmable to provide a first request signal indicating a first data access request for transmission to the memory command processing circuit, wherein the memory command processing circuit provides the first data access request to a memory circuit, wherein the first programmable switch circuit is programmable to provide first data indicated by a first write data signal for storage in the memory circuit through the memory command processing circuit; and
   a second channel circuit comprising a second programmable switch circuit that is programmable to provide one of the first request signal received from the first programmable switch circuit or a second request signal indicating a second data access request for transmission to the memory command processing circuit as a selected request, wherein the memory command processing circuit provides the selected request to the memory circuit, wherein the second programmable switch circuit is programmable to provide one of the first data received from the first programmable switch circuit or second data indicated by a second write data signal for storage in the memory circuit through the memory command processing circuit.

2. The memory controller circuit of claim 1, wherein the first programmable switch circuit comprises:
   a first multiplexer circuit coupled to provide the first write data signal to a first write data buffer circuit in the first channel circuit;
   a second multiplexer circuit coupled to provide the first write data signal to the second channel circuit;
   a third multiplexer circuit coupled to provide the first request signal for transmission to the memory command processing circuit; and
   a fourth multiplexer circuit coupled to provide the first request signal to the second channel circuit.

3. The memory controller circuit of claim 2, wherein the second programmable switch circuit comprises:
   a fifth multiplexer circuit coupled to provide one of the first write data signal or the second write data signal to a second write data buffer circuit in the second channel circuit;
   a sixth multiplexer circuit coupled to provide the first write data signal or the second write data signal to a third channel circuit;
   a seventh multiplexer circuit coupled to provide the first request signal or the second request signal for transmission to the memory command processing circuit; and
   an eighth multiplexer circuit coupled to provide the first request signal or the second request signal to the third channel circuit.

4. The memory controller circuit of claim 1 further comprising:
   a third channel circuit comprising a third programmable switch circuit that is programmable to provide one of the first request signal received from the second programmable switch circuit or a third request signal indicating a third data access request to the memory command processing circuit, wherein the third programmable switch circuit is programmable to provide one of the first write data signal received from the second programmable switch circuit or a third write data signal indicating third data for storage in the memory circuit using the memory command processing circuit.

5. The memory controller circuit of claim 4 further comprising:
a fourth channel circuit comprising a fourth programmable switch circuit that is programmable to provide one of the first request signal received from the third programmable switch circuit or a fourth request signal indicating a fourth data access request to the memory command processing circuit, wherein the fourth programmable switch circuit is programmable to provide one of the first write data signal received from the third programmable switch circuit or a fourth write data signal indicating fourth data for storage in the memory circuit using the memory command processing circuit.

6. The memory controller circuit of claim 1, wherein the first channel circuit further comprises:
a first write data buffer circuit coupled to the first programmable switch circuit that stores the first write data signal; and
a first read data buffer circuit coupled to the first programmable switch circuit that stores first read data accessed from the memory circuit through the memory command processing circuit, wherein the first programmable switch circuit is programmable to provide a first read data signal indicating the first read data to a first output of the memory controller circuit.

7. The memory controller circuit of claim 6, wherein the second channel circuit further comprises:
a second write data buffer circuit coupled to the second programmable switch circuit that stores the second write data signal; and
a second read data buffer circuit coupled to the second programmable switch circuit that stores second read data accessed from the memory circuit through the memory command processing circuit, wherein the second programmable switch circuit is programmable to provide a second read data signal indicating the second read data to a second output of the memory controller circuit.

8. The memory controller circuit of claim 7, wherein the first programmable switch circuit comprises a first multiplexer circuit that is programmable to provide the first read data signal or a third read data signal to the first output, and
wherein the second programmable switch circuit comprises a second multiplexer circuit that is programmable to provide the second read data signal or an output of the first multiplexer circuit to the second output.

9. A memory controller circuit comprising:
a memory command processing circuit;
a first channel circuit comprising a first multiplexer circuit that is configurable to provide a request signal to perform a write operation to a first portion of a memory circuit, wherein the first channel circuit further comprises a second multiplexer circuit configurable to provide a first write data signal indicating first data for storage in the first portion of the memory circuit during the write operation, wherein the first channel circuit further comprises a third multiplexer circuit configurable to provide the request signal, and wherein the memory command processing circuit provides a write request indicated by the request signal and the first data to the first portion of the memory circuit; and
a second channel circuit comprising a fourth multiplexer circuit that is configurable to provide the request signal as received from the third multiplexer circuit to perform the write operation to a second portion of the memory circuit, wherein the memory command processing circuit provides the write request indicated by the request signal to the second portion of the memory circuit.

10. The memory controller circuit of claim 9, wherein the first channel circuit further comprises a fifth multiplexer circuit configurable to provide the first write data signal to the second channel circuit, wherein the second channel circuit further comprises a sixth multiplexer circuit configurable to provide the first write data signal indicating the first data as received from the fifth multiplexer circuit for storage in the second portion of the memory circuit during the write operation, and wherein the memory command processing circuit provides the first data to the second portion of the memory circuit.

11. The memory controller circuit of claim 9, wherein the memory controller circuit is a high bandwidth memory (HBM) controller.

12. The memory controller circuit of claim 9, wherein the second channel circuit further comprises a fifth multiplexer circuit configurable to provide the request signal, and wherein the memory controller circuit further comprises:
a third channel circuit comprising a sixth multiplexer circuit that is configurable to provide the request signal as received from the fifth multiplexer circuit to perform the write operation to a third portion of the memory circuit.

13. The memory controller circuit of claim 12, wherein the first channel circuit further comprises a seventh multiplexer circuit configurable to provide the first write data signal to the second channel circuit, wherein the second channel circuit further comprises an eighth multiplexer circuit configurable to provide the first write data signal to the third channel circuit, and wherein the third channel circuit further comprises a ninth multiplexer circuit configurable to provide the first write data signal indicating the first data for storage in the third portion of the memory circuit during the write operation.

14. The memory controller circuit of claim 12, wherein the second channel circuit further comprises a seventh multiplexer circuit that is configurable to provide a second write data signal indicating second data for storage in the second portion of the memory circuit during the write operation, and wherein the third channel circuit further comprises an eighth multiplexer circuit that is configurable to provide a third write data signal indicating third data for storage in the third portion of the memory circuit during the write operation.

15. The memory controller circuit of claim 9, wherein the first channel circuit further comprises a fifth multiplexer circuit configurable to provide a first read data signal indicating first read data accessed from the first portion of the memory circuit to a first output of the memory controller circuit, and wherein the second channel circuit further comprises a sixth multiplexer circuit configurable to provide a second read data signal indicating second read data accessed from the second portion of the memory circuit to a second output of the memory controller circuit.

16. A method for controlling a memory circuit using a memory controller circuit, the method comprising:

providing a first request signal indicating a first data access request through a first programmable switch circuit in a first channel circuit in the memory controller circuit;

providing a first write data signal indicating first data for storage in the memory circuit through the first programmable switch circuit;

providing the first data access request and the first data to the memory circuit through a memory command processing circuit;

providing one of the first request signal received from the first programmable switch circuit or a second request signal indicating a second data access request through a second programmable switch circuit in a second channel circuit in the memory controller circuit as a selected request;

providing one of the first write data signal received from the first programmable switch circuit or a second write data signal indicating second data for storage in the memory circuit through the second programmable switch circuit as selected data; and providing the selected request and the selected data to the memory circuit through the memory command processing circuit.

17. The method of claim 16 further comprising:

providing one of the first request signal received from the second programmable switch circuit or a third request signal indicating a third data access request through a third programmable switch circuit in a third channel circuit in the memory controller circuit; and providing one of the first write data signal received from the second programmable switch circuit or a third write data signal indicating fourth data for storage in the memory circuit through the third programmable switch circuit.

18. The method of claim 16, wherein providing the first request signal through the first programmable switch circuit further comprises providing the first request signal for transmission to the memory circuit through a first multiplexer circuit, and wherein providing the first write data signal through the first programmable switch circuit further comprises providing the first write data signal for transmission to the memory circuit through a second multiplexer circuit.

19. The method of claim 18 further comprising:

providing the first write data signal to the second channel circuit through a third multiplexer circuit; and providing the first request signal to the second channel circuit through a fourth multiplexer circuit.

20. The method of claim 19, wherein providing one of the first request signal or the second request signal through the second programmable switch circuit further comprises providing one of the first request signal received from the fourth multiplexer circuit or the second request signal through a fifth multiplexer circuit, and wherein providing one of the first write data signal or the second write data signal through the second programmable switch circuit further comprises providing one of the first write data signal received from the third multiplexer circuit or the second write data signal through a sixth multiplexer circuit.

* * * * *